United States Patent [19]

Zeigler

[11] Patent Number: 4,761,464

[45] Date of Patent: Aug. 2, 1988

[54] INTERRUPTED POLYSILANES USEFUL AS PHOTORESISTS

[76] Inventor: John M. Zeigler, 2208 Lester Dr, NE., Albuquerque, N. Mex. 87112

[21] Appl. No.: 910,672

[22] Filed: Sep. 23, 1986

[51] Int. Cl.$^4$ ............................................. C08G 77/22
[52] U.S. Cl. ...................................... 528/30; 430/269; 430/272; 430/326; 528/10; 528/25; 528/28; 528/33; 528/34; 556/430
[58] Field of Search ................. 556/430; 528/33, 34, 528/30, 28, 10, 25; 430/269, 326, 272

[56] References Cited

U.S. PATENT DOCUMENTS

| | | | |
|---|---|---|---|
| 2,554,976 | 5/1951 | Burkhard | 528/10 |
| 2,696,480 | 12/1954 | Gordon et al. | 260/46.5 |
| 2,816,089 | 12/1957 | Willis | 528/24 |
| 2,956,045 | 10/1960 | Merker | 260/46.5 |
| 2,998,440 | 8/1961 | Foster et al. | 260/429.7 |
| 3,165,494 | 1/1965 | Smith | 556/430 |
| 3,318,823 | 5/1967 | Aylett et al. | 528/28 |
| 3,321,501 | 5/1967 | Wilkus et al. | 260/429 |
| 3,328,346 | 6/1967 | Spork | 528/43 |
| 3,340,228 | 9/1967 | Wu | 528/43 |
| 3,344,161 | 9/1967 | Moedritzer et al. | 528/30 |
| 3,393,218 | 7/1968 | Van Wazer et al. | 528/28 |
| 3,414,597 | 12/1968 | Wilkus et al. | 260/429 |
| 3,511,862 | 5/1970 | Moedritzer | 528/25 |
| 3,532,731 | 10/1970 | Hittmair et al. | 260/448.2 |
| 3,706,591 | 12/1972 | Nitzsche et al. | 117/124 F |
| 3,717,665 | 2/1973 | Stuart | 556/430 |
| 3,830,780 | 8/1974 | Nitzsche et al. | 528/16 |
| 3,903,047 | 9/1975 | Ashby | 260/46.5 R |
| 4,247,674 | 1/1981 | Koshar et al. | 528/21 |
| 4,273,420 | 6/1981 | Watanabe et al. | 350/341 |
| 4,358,576 | 11/1982 | Yajima et al. | 528/30 |
| 4,391,963 | 7/1983 | Shirahata | 528/37 |
| 4,523,001 | 6/1985 | Swiger et al. | 528/34 |
| 4,558,112 | 12/1985 | Talcott | 528/10 |
| 4,569,953 | 2/1986 | West et al. | 522/6 |
| 4,587,205 | 5/1986 | Harrah et al. | 430/326 |
| 4,588,801 | 5/1986 | Harrah et al. | 528/33 |
| 4,618,666 | 10/1986 | Porte | 556/430 |
| 4,626,583 | 12/1986 | Arkles | 556/430 |
| 4,639,501 | 1/1987 | Seyferth et al. | 556/430 |

OTHER PUBLICATIONS

The Naming and Indexing of Chemical Compounds from Chemical Abstracts, Chemical Abstracts Service, American Chemical Society, vol. 56, p. 63N (1962).

*Primary Examiner*—Melvyn I. Marquis
*Attorney, Agent, or Firm*—Millen & White

[57] ABSTRACT

Polysilane polymers in which the Si backbone is interrupted by atoms such as O, Ge, Sn, P, etc., are useful photoresists especially in the solvent development mode.

14 Claims, No Drawings

INTERRUPTED POLYSILANES USEFUL AS PHOTORESISTS

The Government has rights in this invention pursuant to Contract No. DE-AC04-76DP00789 awarded by the U.S. Department of Energy.

BACKGROUND OF THE INVENTION

This invention relates to a new class of polysilane-based polymers useful as photoresists.

U.S. Pat. Nos. 4,588,801 and 4,587,205 and Zeigler et al, "Self-Developing Polysilane Deep-UV Resists-Photochemistry, Photophysics, and Submicron Lithography", *SPIE*, 539, 166, 1985, describe a novel class of silicon backbone polymers, polysilanes, which, on exposure to light in the deep UV spectral range rapidly depolymerize and form gaseous siloxanes which volatilize from the surface leaving a positive image. These materials are, thus, "self-developing" and, unlike current resists, require no post-exposure solvent development step to produce an image in the resist. The elimination of this solvent development step constitutes a major advance over current resist technology and leads to lower VLSI fabrication costs stemming from process simplification and lower defect rates in the finished IC's.

Promising as these materials may be, they are not ideally suited to all applications. Their main disadvantage is that they are relatively opaque in the deep UV, with extinction coefficients, at 248 nm of 1000–3000 l/cm$^2$. mole, typically. While this opacity is not a problem for self-developed exposures, it is a problem when the materials are used in a conventional solvent-developed mode. Since most of the light is absorbed in these materials in the top of 0.1 μm of a 1 μm thick film, the top part of the film must be considerably overexposed to allow radiation to penetrate to the bottom of the film. This leads to degradation of resolution and low apparent sensitivity in the solvent developed mode. For effective use as solvent-developed resists, it would be desirable to reduce the value of the extinction coefficient in polysilanes at the exposure wavelength by about a factor of 10.

Another type of silicon-containing polymer is the class of the organopolysiloxanes. See, e.g., U.S. Pat. Nos. 4,247,674, 3,532,731, 3,903,047, 3,706,591, 3,414,597, 3,321,501, 2,998,440, 2,956,045 and 4,273,420. Such polymers contain repeating units of —O—Si—O—. They contain no Si-Si bonds in the main chain as required in polysilanes. Thus, they have essentially no main chain scission photochemistry although organopolysiloxanes are known which potentially might have side chain photochemistry (see U.S. Pat. No. 4,391,963). Since main chain scission photochemistry is an absolute requisite for the use of polysilanes as photoresists, such prior art polymers are of no value.

U.S. Pat. No. 4,358,576 describes another class of Si-containing polymers. However, the main chains of these contain the bonds —CH$_2$—Si—O—V—. Such polymers also are not photosensitive.

U.S. Pat. No. 2,696,480 does disclose polymers containing —Si—Si— bonds, as well as —Si—O—Si—O— linkages. However, this patent also requires —C$_6$H$_4$—Si—C$_6$H$_4$—Si— linkages. The solid-state photochemistry of such polymers is not described.

Trefonas et al (*Journal of Polymer Science: Polymer Chemistry Edition*, Vol. 23, 2099–2107 (1985)) discloses organogermane homopolymers and copolymers containing both germanium and silicon in the main chain. The side groups are chosen from n-butyl, n-hexyl, methyl, cyclohexyl and phenyl. It is very generically stated in this document that such polymers may find the use as photoresists.

SUMMARY OF THE INVENTION

It is an object of this invention to provide a new class of polymers having useful properties as photoresists and which eliminates and/or ameliorates the difficulties mentioned above.

Upon further study of the specification and appended claims, further objects and advantages of this invention will become apparent to those skilled in the art.

These objects have been attained by providing polymers of the formula

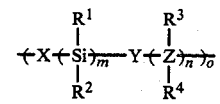

wherein

X is SiR$^5$R$^6$, O, NR$^5$, SnR$^5$R$^6$, GeR$^5$R$^6$, S, PR$^5$, P(=O)R$^5$, AsR$^5$, Se or Te,

Y is independently a group defined for X,

Z is C, Si, Ge, Sn, P or (P=O)

R$^{1-6}$ each independently is H; C$_{6-10}$-aryl; C$_{1-15}$-alkyl; C$_{3-15}$-cycloalkyl; a heterocyclic group of 1-3 fused rings, each containing 4-7 ring atoms, 1-3 of which in each ring are O, N or S, the remainder being C-atoms; or for each of said groups, the corresponding group wherein a H-atom is replaced by C$_{1-10}$-alkyl, C$_{6-10}$-aryl, C$_{3-15}$-cycloalkyl, C$_{1-10}$-alkoxy, OH, SH, NH$_2$, NH(C$_{1-10}$-alkyl), N(C$_{1-10}$-alkyl)(C$_{1-10}$-alkyl), or C$_{1-10}$-(alkoxyalkyl); or —SiR$^7$R$^8$R$^9$; GeR$^7$R$^8$R$^9$; or SnR$^7$R$^8$R$^9$;

R$^{7-9}$ each independently is H, C$_{6-10}$-aryl; C$_{1-15}$-alkyl; C$_{3-15}$-cycloalkyl; a heterocyclic group of 1-3 fused rings, each containing 4-7 ring atoms, 1-3 of which in each ring are O, N or S, the remainder being C-atoms; or for each of said groups, the corresponding group wherein a H-atom is replaced by C$_{1-10}$-alkyl, C$_{6-10}$-aryl, C$_{3-15}$-cycloalkyl, C$_{1-10}$-alkoxy, OH, SH, NH$_2$, NH(C$_{1-10}$-alkyl), N(C$_{1-10}$-alkyl)(C$_{1-10}$-alkyl), or C$_{1-10}$-(alkoxyalkyl);

m is 2 to about 10;

n is 0 to about 100, and o is about 10 to about 100, with the provisos that (a) at least one of X, Y and Z represents a group wherein the atom in the main polymer chain is not Si, (b) when n=0, then X and Y are not both O or both N, (c) when X or Y is GeR$^5$R$^6$ or Z is Ge, then at least one of X, Y or Z is a group wherein the atom in the main polymer chain is not Ge and is not Si, (d) when one of R$^{1-9}$ is alkyl-containing, then the total number of C-atoms in all alkyl groups on the atom in the main polymer chain to which it is bonded is not more than 25, (e) when Z is P or P(=O), R$^4$ is not present, and (f) there are no O—N bonds in the polymer backbone.

These objects have also been achieved by providing a method of photopatterning an image onto a substrate coated with a photoresist, comprising irradiating the coated substrate with actinic radiation forming a pattern of said image on the substrate, whereby the portions of said photoresist coating on which said radiation impinges photodepolymerize to form fragments which are soluble in a solvent in which the unirradiated portions remain insoluble wherein said photoresist is a polymer of this invention which optionally ablatively photodepolymerizes upon exposure to said actinic radiation.

The invention also relates to mixtures of the polymers of this invention with photosensitizers or with photopolymerizable ethylenically unsaturated compounds where the polymers of this invention act as photosensitizers.

This invention takes advantage of the property of polysilanes whereby the wavelength of maximum absorption and the corresponding extinction coefficient is a function of the number of subunits in the polysilane. As the number of subunits decreases from 2000 to 6, the maximum absorption wavelength shifts from 310 nm to 220 nm and the extinction coefficient decreases from 5,000 to 3,200 per monomer unit at the wavelength of maximum absorption. This invention establishes that polymers with short polysilane segments due to the interruption described above can achieve the desired reduction in extinction coefficient mentioned above and/or increased sensitivity due to localization of the excitation energy. (See Zeigler et al, supra.) Regarding the functional dependence of the wavelength of maximum absorption and the extinction coefficient on the number of subunits in polysilanes, see Trefonas et al, "Organosilane High Polymers:Electronic Spectra and Photodegradation", *Journal of Polymer Science:Polymer Letters Addition,* 21:823 (1983), as well as U.S. Pat. Nos. 4,588,801 and 4,587,205.

In the formula for the polymers of this invention, the stated values for m, n and o are, of course, not critical in any given case. While m typically ranges from about 2 to about 10, larger values are contemplated equivalents. Similarly, while the value of n can be up to 100, larger values are also contemplated equivalents although values in the range of 0 to 30 are preferred. Similarly, somewhat shorter oligomers (values of o less than about 10) are also contemplated as equivalents as are polymers wherein values of o are larger than 100.

Typically, the choice of the combination of m, n and o is made in accordance with fully conventional considerations of the desired molecular weight, $T_g$ (glass transition temperature), crystallinity, etc. For the photoresist application, it will be desired to have a crystallinity which is negligible or very low. Accordingly, $T_g$ values as high as 300° C. may be applicable as long as the polymer remains substantially noncrystalline. Within this limit, in general, the higher the $T_g$ the better for photoresist applications. Typically, $T_g$ will be chosen to be above about 40° C., preferably above about 90° C. in order to provide good feature retention in patterned samples.

Similarly, overall molecular weight will be designed to conventionally achieve desired polymer properties. Typically, the weight average molecular weight (e.g., determined by gel permeation chromatography relative to the conventional polystyrene standards) will be above the critical molecular weight for chain entanglement, e.g., typically above about 30,000. Molecular weight, of course, will be chosen to be low enough so that polymer solutions do not become excessively viscous, e.g., lower than about $10^7$. Other details of desirable polymer properties will be chosen in accordance with fully conventional considerations, e.g., in accordance with the disclosures of U.S. Pat. Nos. 4,588,801 and 4,587,205, which are entirely incorporated by reference herein.

The choice of side chain substituents in the polymers of this invention will be much less critical than the choice as described in the two incorporated U.S. patents. In the latter, it was important to choose the side chain substituents so that the combination of steric effects and photodepolymerization fragment weight would be such that sufficient photosensitivity and fragment volatility were insured. For the polymers of this invention, where solvent development is a preferred aspect, this choice will not be as critical. However, where it is desired to have a polymer of this invention be ablatively photodepolymerizable at a given wavelength under a given fluence, of course, the principles clearly enunciated in the mentioned patents can be applied for selection of suitable side groups.

The groups $R^1$ through $R^6$ are independently chosen. The side groups on a given main chain atom can be the same, e.g., dimethyl, or different. Suitable aryl groups will include phenyl, naphthyl, anthryl and other fused aromatic ring systems. Suitable alkyl groups will include methyl, ethyl, n-propyl, isopropyl, n-butyl, isobutyl, sec-butyl, tert-butyl, or pentyl, hexyl, heptyl, octyl, nonyl, decyl, undecyl, dodecyl, tridecyl, tetradecyl or pentadecyl isomers. Suitable cycloalkyl groups include cyclopropyl, cyclobutyl, cyclopentyl, cyclohexyl, cycloheptyl, silacyclobutyl, silacyclopentyl, etc. Such groups having a greater number of C-atoms are also contemplated as equivalents. In general, branched groups such as isopropyl, isobutyl, cyclohexyl, etc., are preferred due to advantageous effects of their bulk on backbone photosensitivity and the increased $T_g$ values they lend to the polymers.

The side substituents can also be heterocyclic in nature including both aromatic and saturated or unsaturated aliphatic ring structures. Since the nature of the side substituent is not critical, the limits being determined primarily from considerations of preparative chemistry, e.g., such side radicals must be able to withstand the reaction chemistry used to prepare the polymers of this invention wherein alkali metals are normally employed, a very wide variety of heterocyclic moieties are appropriate. These include but are not limited to those derived from pyridine, pyrrole, piperidine, piperazine, morpholine, cyclic alkylene imino, pyrrolidine, thiophene, azepine, oxazolidine, thiazole, triazole, imidazole, pyrazole, pyrimidine, purine, quinoline, isoquinoline, picoline, indane, indene, indole, carbazole, benzofuran, dioxane, thionaphthalene, phenothiazine, and many more. Side groups can also be unsaturated but, typically, these will be less preferred due to crosslinking tendencies on exposure.

Any of the foregoing groups can also be substituted by a substituent which is consistent with the reaction chemistry as mentioned above. Thus, suitable substituents include the specific alkyl, aryl and cycloalkyl groups mentioned above, alkoxy groups derived from the corresponding alkyl groups mentioned above, monoalkylamino and dialkylamino groups wherein alkyl is derived from the alkyl portions mentioned above, alkoxyalkyl wherein the alkyl groups are derived from those mentioned above, etc. Many other substituents are contemplated as equivalents, e.g., alkyl groups interrupted by oxa atoms, ether groups (OCO or COO), carbonyl groups (in protected or unprotected forms), etc. The number of substituents will be non-critical, e.g., can be in the range of 1–4, more being possible. In general, in aromatic systems, electron releasing substituents will be preferred.

The groups $R^7$ through $R^9$ can also be chosen from the groups described above for $R^{1-6}$.

As can be seen from the formula above, a wide variety of main chain structures is included within the scope of this invention by appropriate choice of X, Y and Z in conjunction with m and n. Both block-type and random-type copolymers are included. The most preferred class of polymers included within the scope of this invention are those wherein the main chain includes only silicon and oxygen atoms. Other preferred subgenera are those wherein the main chain includes silicon and tin, silicon and phosphorous, silicon, tin and oxygen, silicon, phosphorous and oxygen, silicon, germanium and oxygen, silicon, germanium and nitrogen, silicon, tin and nitrogen, as well as silicon and selenium, tellurium, sulfur or arsenic, optionally in conjunction with oxygen. Thus, as can be seen, the polymers of this invention include a wide variety of linkages all of which are preparable using fully conventional chemistry, e.g., Si—O, Si—N, Si—Sn, Si—Ge, Si—S, Si—C, O—Sn, O—Ge, O—S, O—C, N—Sn, N—Ge, N—S, N—C, Sn—Ge, Sn—S, Sn—C, Ge—S and Ge—C.

The polymers of this invention resemble polysilanes in both their photochemistry, due to the Si—Si bonds in the backbone, and their physical properties since most of the backbone typically remains a polysilane. Accordingly, they preserve the highly advantageous photochemical and plasma etch properties of the polysilanes while, simultaneously, are more useful as solvent-developed resists as a consequence of their lower optical densities in the deep UV.

Another important feature of this invention is that it provides polymers wherein the main chain includes elements forming refractory metal oxides an exposure to oxygen reactive ion etching during the photoresist process, e.g., polymers wherein the main chain includes silicon, germanium and/or tin and oxygen. With respect to the desirability of the formation of refractory metal oxides, see, e.g., Taylor et al, "The Role of Inorganic Materials in Dry Processed Resist Technology", Solid-State Technology, 145 (1984). This property allows the materials to be used in trilayer lithography as etch barrier layers. Such polymers are especially useful in imaging layers for bilayer lithography which promises to dominate high resolution photolithography in future VLSI manufacture. See, B. J. Lin, "Multilayer Resist System," in Introduction to Microlithography, L. F. Thompson et al, Eds, p. 166, ACS (1983).

All of the polymers of this invention can be prepared from known starting materials which often are commercially available and all of which are readily accessible from known starting materials using fully conventional reactions and methods. For example, the polymers containing Si—O bonds can be prepared by oxidation of polysilanes using fully conventional methods such as those exemplified below wherein a polysilane is conventionally oxidized using t-butylhydroperoxide, m-chloroperoxybenzoic acid, or other equivalent oxidizing agents. Such polymers can also be prepared via schemes such as those shown below:

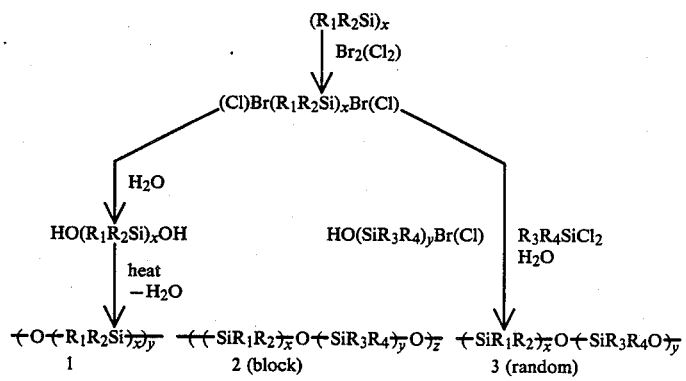

The cyclic silane starting materials used to provide the polysilane fragment are readily available in high yields either commercially or by coupling of appropriate readily available dichlorosilanes using alkali metals. See, e.g., U.S. Pat. Application Ser. No. 851,713 and J. M. Zeigler, Polymer Preprints, 27, No. 1, 109 (1986). Mixed structures wherein the silicon units have different side chains can be readily prepared through reductive co-couplings under the same conventional conditions. The cyclosilane cleavage with bromine or chlorine can readily be carried out using 0.8–2.0 equivalents of halogen at temperatures from −20° to 80° C. and reaction times of 1 minute to 24 hours. The subsequent hydrolysis of the resulting alpha, omega-dihalide is also carried out efficiently and in high yields at temperatures of 0°–180° C. under reaction times of 10 minutes to 24 hours in a solvent in which the dihalide and water are soluble (e.g., tetrahydrofuran).

Normal considerations of polymer chemistry will be employed to choose the configuration along the polymer chain, e.g., as illustrated by structures 1, 2 and 3 in the schemes above. A particularly accessible class of materials is that in which X or Y is oxygen, m is 5 or 6, n is 0 and o is 30–100. These materials have the structure 1 shown above, i.e., regular block homopolymers. Equally preferred are the random copolymers of structure 3 shown above. (See Example 2 below). One such group of structures is readily available by directly copolymerizing dichlorosilanes with 1,2-dichlorodisiloxanes with sodium metal in a manner highly analogous to that described above for dichlorosilane polymerization. These procedures yield a random distribution of siloxane units. Since one of the major advantages of the interrupted polysilane polymers relative to the polysilanes of the prior art is their decreased UV absorption, random or alternating placement of the siloxane bonds in the backbone is greatly preferred over block copolymers in which the siloxane units are grouped together. Random or alternating placement of the siloxanes leads to maximum disruption of the UV absorbing polysilane segments with a minimum decrease in the polymer's $T_g$.

Of course, other random and block homo- and copolymer combinations are fully included within the scope of this invention, e.g., such as the regular block copolymers of structure 2 shown above. All of these variants of this invention have the desired photochemistry and have differing physical properties in accordance with the precise structures involved.

Incorporation of oxygen into any of the polymers of this invention can be routinely accomplished analogously to the method described above for polysilanes, e.g., by oxidation of the polymer using an appropriate oxidizing agent. This can also be achieved by conventional direct reductive copolymerization of a dihalodimetalloxane with a dihaloorgano-metalloid compound as in Example 2 or by reacting a living polyorganometalloid with a hydroxy-terminated polymetalloxane as in Example 1. Moreover, sulfur can conventionally be incorporated into cyclic oligosilanes, e.g., using the method of Carlson et al, *Organometallics*, 2:1978 (1983), by simply heating the polymetalloid with elemental sulfur. A similar scheme can be utilized for selenium and tellurium. Nitrogen can be incorporated into the polymers by direct copolymerization, e.g., by introducing nitrogen or an appropriate primary amine into the polymerization reaction having living chloroterminated polymer chains. Incorporation of tin can be accomplished analogously to the methods exemplified herein for germanium. Incorporation of arsenic can be accomplished analogously to the methods described herein for phosphorous. Carbon can be incorporated into the polymer backbone by conventionally polymerizing the dichlorodisilanes with a haloalkyl (or haloaryl) diorganohalosilane, e.g., chloromethyldimethylchlorosilane or 3-chloropropyldimethylchlorosilane using Na metal as described in the cited reference.

In essence, the materials of this invention can be utilized as high or low resolution photoresists in accordance with the methods described in U.S. Pat. Nos. 4,588,801 and 4,587,205 as well as Zeigler et al, all incorporated above, in an ablative photodepolymerization mode or can be utilized analogously to the many conventional photoresists used in conventional solvent-development mode. In general, where the fluence is relatively high, the polymers can be made to photodepolymerize ablatively; where the fluences are lower, the polymers can be used as solvent developable resists. For example, the polymers having structure 1 above, at high fluences of above 400 mJ/cm$^2$, will be selfdeveloping. At lower fluences, e.g., less than about 100 mJ/cm$^2$ for a 1 micron thick film, the photoresists will typically be solvent developable. For polymers having the structure 2 above, the primary manner of use would be as solvent developed resists. For structure 3 above, the situation will probably be borderline where the degree of photovolatilization will depend on the relative numbers of silane and siloxane moieties in the chain.

In all of the polymers of this invention, the photosensitivity and photovolatility of the polymers will depend not only on the structure of the main chain per se, but also on the structure of the side chains as discussed above and described fully in detail in the references incorporated above. Typically, the side chains will be bulky alkyl groups or aryl groups substituted with electron releasing groups, e.g., methoxy, dimethylamino, etc. These impart high photosensitivity. Of course, as discussed above, the side chains will also be chosen to impart advantageous physical properties to the resulting polymer as will be clear to those of skill in the art. Where polymers have germanium or tin in the main chains, a higher photosensitivity will be imparted due to desirable localization of triplet state excitation at Si—Ge or Si—Sn bonds. See, Zeigler et al, SPIE, 539, 166, 1985.

Typically, fluences in the range of 0.1 mJ/cm$^2$/pulse up to about 50 mJ/cm$^2$/pulse will be employed when the polymers are utilized in the solvent development mode. Total fluences in this mode will be on the order of 100 mJ/cm$^2$. For the ablating, self-development mode, fluences of 1-100 mJ/cm$^2$/pulse will normally be involved. Total fluences will typically be in the range of 2-1000 mJ/cm$^2$. The precise fluences involved will vary in accordance with the photosensitivity of the polymer as described above. Typical wavelengths will be in the range of 340 nm to the deep UV, typically down to about 220 nm. Where it is desired to use a wavelength to which the polymer is not photosensitive, of course, fully conventional photosensitizers well known to those of skill in the art can be employed. In this regard, it is also possible to use the polymers of this invention as photosensitizers in conjunction with other compounds not as sensitive at wavelengths at which the polymers of this invention are acceptably sensitive, e.g., they can be used in conjunction with photopolymerizable ethylenically unsaturated monomers or prepolymers very well known to those of skill in the art. Typical conventional photosensitizers and photopolymerizable compounds are discussed, for example, in S. L. Murov, *Handbook of Photochemistry*, Marcel Dekker, Inc., N.Y., 1973; R. West et al, *J. of Radiation Curing*, Vol. 13, p. 35 (1986) and also U.S. Pat. No. 4,569,953.

For application or stripping of the photoresists of this invention from substrates, e.g., those involved in microelectronics such as silicon, a wide variety of conventional non-polar solvents can be utilized, e.g., toluene, xylene, higher alkanes, octanes, etc. For the development step, solvent mixtures typically will be employed wherein a good solvent for the polymer (e.g., toluene, decane, tetrahydrofuran, ethyl acetate, isobutyl acetate, butyl acetate, etc.) will be combined with a poor solvent for the polymer, e.g., an alkanol, e.g., a lower alkanol such as methanol, ethanol, propanol, butanol, pentanol, etc. It is also possible to strip the photoresists using very high UV fluences as described in the references incorporated above.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the preceding text and the following examples, all temperatures are set forth uncorrected in degrees Celsius and all parts and percentages are by weight, unless otherwise indicated.

EXAMPLE 1

Vinyl-(SiMe$_2$O)$_n$(PhMeSi)$_n$O(SiMe$_2$O)$_n$Vinyl

Sodium dispersion (9.9 g of 40% dispersion in light oil, 172.7 mg-atom) was added dropwise to a refluxing solution of fractionally distilled phenylmethyldichlorosilane (15.0 g, 78.5 mmol) in 100 ml dry heptane. Upon completion of the addition, the mixture was allowed to reflux for 2 hr., whereupon it was cooled to room temperature and 112 g of vinyl(-SiMe$_2$O)$_n$H($\bar{n}$=405) containing about 2% xylene was added in a single portion. The resulting mixture was stirred at room temperature for 18 hours, then heated to reflux for about one minute. After cooling, precipitated NaCl by-product was removed by filtration. Solvent removal from the filtrate afforded an oil. The NaCl by-product was washed with 100 ml toluene in 3 portions and that filtrate evaporated to dryness to give 3 g of a white solid which was shown by IR spectral comparison with an authentic sample to be (PhMeSi)$_n$.

The heptane soluble oil above was diluted with 2 vols. hexanes and cooled to $-20°$ to give a solid which was also identified as (PhMeSi)$_n$. The decanted hexanes solution was further treated with 5 vols. 2-propanol, cooled to $-20°$ and the top phase from the resulting 2-phase mixture decanted. Two further treatments in like manner provided a white solid which was further purified by trituration with cold hexanes. Precipitation of the resulting white solid from toluene with methanol gave 500 mg of a white rubbery solid, identified by infrared and NMR spectroscopy as the title compound, a siloxane-silane-siloxane triblock copolymer with long silane and siloxane blocks. IR(KBr wafer): 1435 (Si—Ph), 1250 (Si—CH$_3$), 1100 (Si—O very strong), 730 (Si—Ph), 700 (Si—Ph), 665 (Si—Ph).

Of course, the vinyl end groups in this polymer are typical of moieties which are contemplated equivalents of structures literally included in the formula above. For example, in essence, any dichlorosilane starting material can be utilized as long as its substituents are compatible with the preparative chemistry utilized to prepare the polymer of this invention, as discussed above.

EXAMPLE 2

(3 Isopropyl methyl Si/Me$_2$Si—O—SiMe$_2$)$_n$

A dry heptane solution of 21.0 g (133 mmol) isopropylmethyldichlorosilane and 9.04 g (44.5 mmol) 1,3-dichlorotetramethyldisiloxane was heated to reflux and 40% Na dispersion in light oil (9 g, 391 mg-atom) added at a rate of 320 meq/min. The reaction mixture was allowed to reflux for 2 hours after completion of the addition and then allowed to cool to ambient temperature. Excess Na was destroyed by addition of methanol and precipitated NaCl dissolved by addition of 1 vol. of saturated aqueous NaHCO$_3$ solution. The layers were separated and a small amount of insoluble material removed by filtration. After removal of solvent from the filtered organic phase, an oil was obtained. Crude product was precipitated from this oil by addition of about 5 volumes ethyl acetate. The crude product was purified by an additional precipitation from toluene solution with ethyl acetate to give 0.855 g of product. The infrared spectrum of this material had bands at 1050 and 1100 cm$^{-1}$ characteristic of the Si—O—Si structural unit and a band at 1380 characteristic of isopropyl geminal dimethyl groups. The weight average molecular weight ($\bar{M}_w$) was determined by gel permeation chromatography to be 47000 relative to polystyrene standards.

EXAMPLE 3 t-Butylhydroperoxide Oxidation of (cyclohexyl MeSi/Me$_2$Si)$_n$

The silane copolymer (0.3 g, 3.27 meq.) was dissolved in 20 ml CCl$_4$ and t-butylhydroperoxide (0.11 ml of 6M solution, 0.2 meq) added. The mixture was stirred for 14 days at ambient temperature and the product isolated by precipitation from the CCl$_4$ solution with ethyl acetate. The crude product was further purified by precipitation from THF solution with methanol to give 0.2 g of white solid. A comparison of the infrared spectrum of this product with that of the starting polysilane showed increased and broadened absorption in the 1050–1150 cm$^{-1}$ region (attributable to Si—O—Si linkages) and a new absorption at 1258 cm$^{-1}$ region attributable to OSi—CH$_3$ groups. The "blocky" silane-siloxane copolymer product had $\bar{M}_w$ 74000 by gel permeation chromatography.

EXAMPLE 4 m-Chloroperoxybenzoic acid Oxidation of (Cyclohexyl MeSi/Me$_2$Si)$_n$

A solution of 0.535 g of the above copolymer (5.8 meq) in 40 ml dry benzene was treated with 0.2 g (1.16 mmol) m-chloroperoxybenzoic acid in a single portion and the mixture heated to reflux for 2 hours. After cooling for 14 hours, methanol was added to precipitate the product as a sticky mass. This was redissolved in THF and methanol added to precipitate the purified product. It was isolated by filtration and dried for 16 hours to give 0.43 g of pure white product. The infrared spectrum of this showed a strong new band at 1040 (Si—O stretch) and 1258 (OSi—CH$_3$ stretch). The UV spectrum of this material was blue-shifted by only 5 nm relative to the starting polymer, suggesting that the oxygen atoms had been inserted to give a primarily block-type structure, since random insertion would give a polymer with a strongly blue-shifted UV spectrum due to disruption of sigma-conjugation in the polysilane backbone.

EXAMPLE 5

Synthesis of Regular H(O(SiEt$_2$)$_5$)$_n$H

Purified cyclic (Et$_2$Si)$_5$ (2 g, 4.6 mmol) was dissolved in dry benzene and treated dropwise with 0.24 ml (4.6 mmol) bromine. Immediate reaction of the bromine occurred as evidenced by instantaneous decoloration of the bromine on contact with the dry benzene solution. Upon completion of the Br$_2$ addition, the solvent was evaporated at reduced pressure and replaced with 20 ml of 1:1 THF/H$_2$O containing 0.75 ml (9.2 mmol) of pyridine. A white precipitate of pyridinium hydrochloride appeared immediately. After stirring for 2 hours at ambient temperature, 5 ml hexanes and 50 ml H$_2$O were added to the reaction mixture. The layers were then separated and the organic phase freed of solvent at reduced pressure to afford crude HO(SiEt$_2$)$_5$OH as a colorless oil. Spectral data in accord with this structure were obtained, although the infrared spectrum suggested partial polymerization had occurred. This material was not purified further but was, instead, polymerized directly.

Neat (HO(SiEt$_2$)$_5$OH (0.8 g) was heated with a catalytic amount of p-toluenesulfonic acid to 100° C. for 24 hours. A viscous crude product was obtained, which, while still relatively low in molecular weight (<5000) showed a substantial reduction in SiOH absorption in the infrared, suggesting that oligomerization had occurred.

EXAMPLE 6

Synthesis of (Ph$_2$Ge)$_n$-based polymers

A solution of 3.04 g (10.1 mmole) Ph$_2$GeCl$_2$ in 100 ml refluxing dry toluene was treated dropwise with 1.27 g of 40% Na dispersion in light oil (22.2 mg-atom). Upon completion of the Na addition, the mixture was allowed to cool, then quenched by sequential addition of 5 ml methanol and 100 ml sat. aqueous NaHCO$_3$. The toluene phase from the resulting mixture was filtered to remove insoluble material and stripped of solvent to yield a yellow oil. Addition of 5 vols. of hexane gave a lemon yellow solid which was further purified by precipitation from toluene with hexane and from tetrahydrofuran with methanol to provide 50 mg of lemon yellow (Ph$_2$Ge)$_n$. IR and 1HNMR data consistent with this structure were obtained. Size exclusion chromatography (SEC) gave an indicated molecular weight of 2000 (relative to polystyrene standards).

A corresponding polymer containing Ge—Si bonds is prepared in accordance with the foregoing examples by adding to the polymerization batch an appropriate dichlorosilane. The resultant polymer is then oxidized as described in the examples above to produce a polymer backbone containing Ge, Si and O atoms.

EXAMPLE 7

Synthesis of (10PhMeSi/PhP)$_n$

A 30% n-dodecane solution of PhMeSiCl$_2$ (9.52 g, 49.8 mmol) and PhPCl$_2$ (0.89 g, 4.98 mmol) was added dropwise to a refluxing mixture of 5.45 g (118 mg-atom) of 50% mineral spirits Na dispersion slurried in n-dodecane. After completion of the addition, the mixture was allowed to reflux for 2 hr., then allowed to cool to room temperature overnight. After a quenching similar to that in Example 1, 3 vols. of toluene were added to dissolve precipitated polymer, the layers separated, and the toluene removed in vacuo from the organic phase. The resulting precipitated polymer was isolated by filtration and purified by four precipitations from toluene solution with hexane to provide 365 mg of light tan title polymer. SEC gave a molecular weight of 10000 for this material. Phosphorus analysis by inductively coupled plasma gave a phosphorus content consistent with the ratio indicated above. Unlike polysilanes, the phosphorus containing copolymer is air-sensitive, with complete oxidation to a polymeric silane-phosphine oxide occuring in air after 1 month.

EXAMPLE 8

Incorporation of S, Se and Te Into Polysilane-Type Structures

A mixture of finely divided elemental sulfur, selenium or tellurium and a conventional polysilane dissolved in an appropriate inert solvent, e.g., decalin, is heated to a temperature of approximately 50°-200° C. in conventional dependence upon the particular polysilane structure involved. The ratio of elemental S, Se or Te to polysilane is a function of the desired level of incorporation of the element into the polymer. The resulting reaction product is allowed to cool to ambient temperature, whereupon unreacted sulfur, selenium or tellurium is removed from the solution by filtration. The resulting clear solution is treated with a non-solvent for the polymer (e.g., methanol) to effect its precipitation from solution. The poly(silane sulfide, silane telluride, silane selenide, silane sulfide/selenide, selenide/telluride, etc.) is then isolated by filtration or decantation and air-dried. A product of higher purity can be obtained by further precipitations.

EXAMPLE 9

Synthesis of Poly(silane nitrides)

A bis-chloro-terminated polysilane of the desired structure is prepared in accordance with the first part of Example 1. This polysilane is treated in situ with exactly 3 equivalents of ammonia or a primary amine and agitated at elevated temperature to complete reaction. After filtration of the resulting slurry to remove NaCl byproduct, the solvent is removed from the solution in vacuo. The polymer is isolated and purified by precipitation in conventional manner.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A polymer of the formula

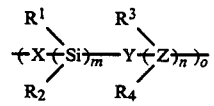

wherein
X is SiR$^5$R$^6$, O, NR$^5$, SnR$^5$R$^6$, GeR$^5$R$^6$, S, PR$^5$, P(=O)R$^5$, AsR$^5$, Se or Te,
Y is independently a group defined for X,
Z is C, Si, Ge, Sn, P or P(=O),
R$^{1-6}$ each independently is (a) H; (b) C$_{6-10}$-aryl; (c) C$_{1-15}$-alkyl; (d) C$_{3-15}$-cycloalkyl; (e) a heterocyclic group of 1-3 fused rings, each containing 4-7 ring atoms, 1-3 of which in each ring are O, N or S, the remainder being C-atoms; (f) one of (b)-(e) wherein a H-atom is replaced by C$_{1-10}$-alkyl, C$_{6-10}$-aryl, C$_{3-15}$-cycloalkyl, C$_{1-10}$-alkoxy, OH, SH, NH$_2$, NH(C$_{1-10}$-alkyl), N(C$_{1-10}$-alkyl) (C$_{1-10}$-alkyl), or C$_{1-10}$-(alkoxyalkyl); (g) —SiR$^7$R$^8$R$^9$; (h) GeR$^7$R$^8$R$^9$; or (i) SnR$^7$R$^8$R$^9$;
R$^{7-9}$ each independently is (a) H; (b) C$_{6-10}$-aryl; (c) C$_{1-15}$-alkyl; (d) C$_{3-15}$-cycloalkyl; (e) a heterocyclic group of 1-3 fused rings, each containing 4-7 ring atoms, 1-3 of which in each ring are O, N or S, the remainder being C-atoms; or (f) one of (b)-(e) wherein H-atoms is replaced by C$_{1-10}$-alkyl, C$_{6-10}$-aryl, C$_{3-15}$-cycloalkyl, C$_{1-10}$-alkoxy, OH, SH, NH$_2$, NH(C$_{1-10}$-alkyl), N(C$_{1-10}$-alkyl) (C$_{1-10}$-alkyl), or C$_{1-10}$-(alkoxyalkyl);
m is 2 to about 10;
n is 0 to about 100, and
o is about 10 to about 100,
with the provisos that (a) at least one of X, Y and Z represents a group wherein the atom in the main polymer chain is not Si,
(b) when n=0, then X and Y are not both O or N,
(c) when X and Y is GeR$^5$R$^6$ or Z is Ge, then at least one of X, Y or Z is a group wherein the atom in the main polymer chain is not Ge and is not Si,
(d) when one of R$^{1-9}$ is alkyl-containing, then the total number of C-atoms in all alkyl groups on the atom in the main polymer chain to which it is bonded is not more than 25,
(e) when Z is P or P(=O), R$^4$ is not present,
(f) there are no O—N bonds in the polymer backbone and
(g) when the polymer backbone has only Si and O atoms, R$^1$ is isopropyl, C$_{4-15}$-alkyl, C$_{6-10}$-aryl or one of (d)–(i) defined above for R$^1$.

2. A polymer of claim 1, wherein the main chain atom in one of X, Y and Z is Ge and one is O.

3. A polymer of claim 1, wherein the main chain atoms of X, Y and Z are all Si or Sn.

4. A polymer of claim 1, wherein the main chain atoms of X, Y and Z are all Si or P.

5. A polymer of the formula

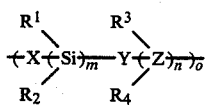

wherein
X is SiR$^5$R$^6$ or O,
Y is independently a group defined for X,
Z is Si,
R$^1$ is (a) isopropyl; (b) C$_{4-15}$-alkyl; (c) C$_{6-10}$-aryl; (d) C$_{3-15}$-cycloalkyl; (e) a heterocyclic group of 1–3 fused rings, each containing 4–7 ring atoms, 1–3 of which in each ring are O, N or S, the remainder being C-atoms; (f) one of (b)–(e) wherein a H-atom is replaced by C$_{1-10}$-alkyl, C$_{6-10}$-aryl, C$_{3-15}$-cycloalkyl, C$_{1-10}$-alkoxy, OH, SH, NH$_2$, NH(C$_{1-10}$-alkyl), N(C$_{1-10}$-alkyl) (C$_{1-10}$-alkyl), or C$_{1-10}$-(alkoxyalkyl); (g) —SiR$^7$R$^8$R$^9$; (h) GeR$^7$R$^8$R$^9$; or (i) SnR$^7$R$^8$R$^9$;
R$^{2-5}$ each independently is (a) H; (b) C$_{6-10}$-aryl; (c) C$_{1-15}$-alkyl; (d) C$_{3-15}$-cycloalkyl; (e) a heterocyclic group of 1–3 fused rings, each containing 4–7 ring atoms, 1–3 of which in each ring are O, N or S, the remainder being C-atoms, (f) one of (b)–(e) wherein a H-atom is replaced by C$_{1-10}$-alkyl, C$_{6-10}$-aryl, C$_{3-15}$-cycloalkyl, C$_{1-10}$-alkoxy, OH, SH, NH$_2$, NH(C$_{1-10}$-alkyl, ) N(C$_{1-10}$-alkyl) (C$_{1-10}$-alkyl), or C$_{1-10}$-(alkoxyalkyl); (g) —SiR$^7$R$^8$R$^9$; (h) GeR$^7$R$^8$R$^9$; or (i) SnR$^7$R$^8$R$^9$;
R$^{7-9}$ each independently is (a) H; (b) C$_{6-10}$-aryl; (c) C$_{1-15}$-alkyl; (d) C$_{3-15}$-cycloalkyl; (e) a heterocyclic group of 1–3 fused rings, each containing 4–7 ring atoms, 1–3 of which in each ring are O, N or S, the remainder being C-atoms; or (f) one of (b)–(e) wherein a H-atom is replaced by C$_{1-10}$-alkyl, C$_{6-10}$-aryl, C$_{3-15}$-cycloalkyl, C$_{1-10}$-alkoxy, OH, SH, NH$_2$, NH(C$_{1-10}$-alkyl), N(C$_{1-10}$-alkyl) (C$_{1-10}$-alkyl), or C$_{1-10}$-(alkoxyalkyl);
m is 2 to about 10;
n is 0 to about 100, and
o is about 10 to about 100,
with the provisos that
(a) when n=0, then X and Y are not both O, and
(b) when one of R$^{1-9}$ is alkyl-containing, then the total number of C-atoms in all alkyl groups on the atom in the main polymer chain to which it is bonded is not more than 25.

6. A polymer of claim 5, wherein R$^{1-9}$ are one of said aryl, alkyl, cycloalkyl groups or one of said groups substituted by one of said alkyl, aryl, cycloalkyl, alkoxy, NH(C$_{1-10}$-alkyl) or N(C$_{1-10}$-alkyl) (C$_{1-10}$-alkyl) groups.

7. A polymer of claim 5, wherein R$^{1-9}$ are C$_{1-6}$-alkyl, phenyl, C$_{1-4}$-alkylphenyl, phenyl-C$_{1-4}$-alkyl, or cyclohexyl.

8. A polymer of claim 5, wherein R$^{1-9}$ are isopropyl, phenyl, cyclohexyl, phenethyl, or 3-dimethylaminopropyl.

9. A polymer of claim 5, wherein m, n and o are chosen such that the T$_g$ of the resultant polymer is above about 40° C. and the polymer is substantially non-crystalline.

10. A polymer of claim 1, wherein at least one of R$^{1-6}$ is GeR$^7$R$^8$R$^9$.

11. A polymer of claim 5, which is a block copolymer.

12. A polymer of claim 5, which is a random copolymer.

13. A polymer of claim 1, which is a random copolymer.

14. A polymer of claim 5, wherein R$^{7-9}$ each independently is H or alkyl.

* * * * *